(12) United States Patent
Brown

(10) Patent No.: US 6,633,242 B2
(45) Date of Patent: Oct. 14, 2003

(54) ENTROPY CODING USING ADAPTABLE PREFIX CODES

(75) Inventor: Russell A. Brown, Palo Alto, CA (US)

(73) Assignee: Sun Microsystems, Inc., Santa Clara, CA (US)

( * ) Notice: Subject to any disclaimer, the term of this patent is extended or adjusted under 35 U.S.C. 154(b) by 149 days.

(21) Appl. No.: 09/779,333

(22) Filed: Feb. 8, 2001

(65) Prior Publication Data

US 2002/0145545 A1 Oct. 10, 2002

(51) Int. Cl.⁷ .................................................. H03M 7/46
(52) U.S. Cl. ............................................. 341/50; 341/51
(58) Field of Search .......................... 341/50, 65, 106, 341/67, 51, 59, 63; 382/232

(56) References Cited

U.S. PATENT DOCUMENTS 5,642,115 A  *  6/1997  Chen ............................ 341/67
5,764,168 A  *  6/1998  Kim ............................. 341/63
6,075,470 A  *  6/2000  Little et al. ................. 341/107
6,298,160 B1 * 10/2001  Goertzen ..................... 382/232

* cited by examiner

Primary Examiner—Peguy JeanPierre
Assistant Examiner—Joseph J. Lauture
(74) Attorney, Agent, or Firm—J. D. Harriman, II, Esq.; Coudert Brothers LLP

(57) ABSTRACT

The present invention provides an entropy coding scheme using an adaptable prefix code. The prefix code is a binary representation of the algorithm used to compress and decompress the data. There are prefix zeros that represent the number of significant binary digits that follow the first one. According to one embodiment, this scheme works on both positive and negative integers and encodes lower order integers with a smaller length of codeword. In another embodiment, the zero integer is encoded as a special case with the shortest codeword. In yet another embodiment, the present scheme is preferred by data sets that are clustered about zero, such as image data sets that have been transformed via a wavelet transform or a discrete cosine transform.

14 Claims, 5 Drawing Sheets

FIGURE 1 - POSITIVE INTEGERS

FIGURE 2 - NEGATIVE INTEGERS

ENTROPY CODING USING ADAPTABLE PREFIX CODES

BACKGROUND OF THE INVENTION

1. Field of the Invention

The present invention relates primarily to the field of data compression, and in particular to an entropy coding method using adaptive prefix codes.

Portions of the disclosure of this patent document contains material that is subject to copyright protection. The copyright owner has no objection to the facsimile reproduction by anyone of the patent document or the patent disclosure as it appears in the Patent and Trademark Office file or records, but otherwise reserves all rights whatsoever.

2. Background Art

Computer systems are increasingly being used to play back multimedia (audio and video) files. Current computer systems are often unable to transfer data from a file quickly enough from storage to permit adequate playback of a multimedia file. This delay is directly proportional to the amount of data to be transferred.

One way to solve the problem of transmitting a large file is to compress the data for transmission and decompress it back at the destination. However, some compression schemes are not suitable for environments where there is little processing power available (thin clients), or either the compression or decompression schemes are difficult to perform, or require prior knowledge of certain parameters in the schemes.

As mentioned earlier, computers are often used to process, play back, and display video data. This data may come from sources such as storage devices, on-line services, VCRs, cable systems, broadcast television tuners, etc. Video data is not only memory intensive, that is, video data requires large amounts of memory for storage and use by a computer system, but requires the computer system to continuously and uninterruptedly process, play back, and display the data.

To reduce the transmission bandwidth and memory requirements when working with video data, various compression schemes have been developed so that less storage space is needed to store video information and a smaller bandwidth is needed to transmit it. Prior art video compression schemes include Motion JPEG, MPEG-1, MPEG-2, Indeo, QuickTime, True Motion-S, CinePak, etc.

Entropy Coding

Entropy coding is a method of compressing data that is used by video and graphics compression schemes. Entropy coding produces a unique code for each entity of text, audio, video, or graphics data in the file. The length of these code words is based on the probability of the occurrence of the data represented by the code word. Huffman and Golomb coding schemes are two known entropy encoding methods that are extensively used by most present text, audio, video, and graphics compression schemes.

Huffman Coding Scheme

The Huffman coding scheme is perhaps the best and most widely used form of entropy coding. It uses an algorithm known as the "greedy" algorithm to accomplish its task. The greedy algorithm obtains an optimal solution to a problem by making a sequence of choices. For each decision point in the algorithm, the choice that seems best at the moment is chosen. This heuristic strategy does not always produce an optimal solution, but does in most cases. Two ingredients of the Huffman greedy algorithm are the greedy-choice property (a global optimal solution can be derived at by making a locally optimal choice) and optimal substructure (the optimal solution to a problem contains within it optimal solutions to subproblems).

Entropy encoding can be either fixed length or variable length. Consider an example of compressing an alphanumeric file. ASCII coding schemes use 8 bits for each alphanumeric (letter or number) character. Thus, a file that contains 100,000 characters requires 800,000 bits to represent its data. Assume that the file comprises of just six characters, viz. "a", "b", "c", "d", "e" and "f".

Entropy encoding is implemented by determining the frequency of the occurrence of the characters in the file. The table below represents the frequency of occurrence of each character in the example file and proposes a coding solution for fixed length and variable length coding schemes.

TABLE 1

|  | a | b | c | d | e | f |
|---|---|---|---|---|---|---|
| Frequency | 40000 | 10000 | 12000 | 18000 | 5000 | 7000 |
| Fixed-length codeword | 000 | 001 | 010 | 011 | 100 | 101 |
| Variable-length codeword | 0 | 10 | 01 | 00 | 001 | 000 |

Fixed Length Encode

In the fixed length encoding scheme, the maximum number of bits needed to represent the actual number of characters used in the file is determined. If this number of bits is less than the number of bits needed to represent all characters in the alphanumeric set, then compression is possible. For example, with six characters, three bits are needed to encode the six alphabets where "a"=000, "b"=001, "c"=010, "d"=011, "e"=100, and "f"=101. (By comparison, a file with nine characters needs four bits to encode, and a file with more than 128 characters (but less than 257) needs eight bits to encode). Using this scheme requires 3*100,000=300,000 bits to encode the entire example file. This is a savings of approximately 62.5% (300,000 bits as compared to 800,000 bits) over the uncompressed version. (It must be noted though, that a file with more than 128 characters (but less than 257) will require the same number of bits to store or transmit in both the compressed and uncompressed versions because the codeword for the characters will need 8 bits to encode, meaning no compression is achieved).

Variable Length Encoding

Variable-length coding schemes assign frequent characters short codewords and infrequent characters long codewords. In the example, we have encoded "a" with a single bit since it is the most frequently occurring character (40,000 occurrences). The next most frequently occurring characters "b", "c", and "d" are represented by with two bits, and "e" and "f" with are represented by three bits as the least frequently occurring characters. Using variable length encoding, the scheme requires 156,000 bits (40000*1= 10000*2=12000*2=18000*2=5000*3=7000*3) to encode the entire file. This is a savings of approximately 80.5% (156,000 bits as compared to 800,000 bits) over the uncompressed version and significant savings over the fixed length encoding scheme.

Decode

Using either of the above mentioned code schemes, the decoding process occurs as follows: the first bit is received and checked with the table to see if it represents an allowed codeword. If so, the decode process is over. If not, the second bit (if one exists) is received, and the two bits in combination are checked with the table to see if they represent an allowed codeword. As long as an allowed codeword has not been received, the process of receiving new bits and the checking of the ensemble of bits with the table continues, which can be a lengthy and tedious procedure.

Drawbacks With Huffman's Scheme

There are several drawbacks with the Huffman coding scheme. Firstly, a binary code has to be chosen for the frequency occurrence of characters (alphabets, numbers, punctuation characters, and audio, video, or color entities) for each data file, which will vary from one file to another depending on the frequency of occurrence of the character in the file. This means that the scheme will vary from not only data file to data file, but also if changes are made to the data file in the future. Secondly, in order to calculate the frequency occurrence of characters in a data file, the scheme has to first make a quantitative assessment of the characters, after which it has to go back to the beginning of the data file to assign the chosen binary code for each character. This means that the scheme has to make two passes of the file in order to encode—a time consuming procedure. In order to avoid lengthy encoding computations, like in the case of MPEG and JPEG, fixed Huffman codes are sometimes used which reduces the lengthy procedure to some extent. Thirdly, the decoding process may become difficult to accomplish since the contents of the data file are read by the computer as one long string of 1's and 0's and there is no definitive marker to separate the codeword of one character from the next. Further, this decoding process may become difficult to accomplish if the file contains most or all of the known characters. As explained earlier, the scheme has to check one bit at a time in combination with previous bits in the codeword. This means that if the data file contains more characters, the binary codeword chosen gets longer resulting in a tedious checking procedure that not only increases the latency of the scheme, but also increases operational costs. At times, a lookup table is used to check more than one bit at a time, and this reduces the checking procedure time to some extent. Fourthly, the table, like the one shown in Table 1, will not only become large, but each character has to be checked with all the entries in the table—a time consuming process. This means that even though the Huffman's scheme is a good compression scheme, decoding is time consuming and tedious, especially for thin clients that have little computing power, minimal memory, and very little time to decode the compression scheme.

Golomb Coding Scheme

In order to simplify the decoding process of the Huffman scheme, a prior art scheme known as the Golomb scheme produces codewords that are simpler to decode. The encode and decoding procedures using the Golomb scheme are explained below.

Encode

Given a non-integer "a" and a code base "b", the Golomb code is constructed by first dividing "a" by "b" to obtain a quotient "q", and a remainder "r". The base "b" is the base system from which a legal non-integer "a" is chosen. Thus, non-integers 0 through 9 can be chosen for a 10 (decimal) base system, and non-integers 0 through 9, and letters A through F can be chosen for a 16 (hexadecimal) base system. The quotient "q" is then represented using a unary representation, which is the number of zeros equal to the quotient "q" followed by a one. So, for example, the unary of 1=01, and the unary of 5=000001. This unary representation is post-catenated by the binary representation of the remainder "r" to form the Golomb codeword $G_b(a)$. For example, if non-integer "a"=15 is chosen from a code base "b"=7, then "q"=2 and "r"=1. Since the unary representation of "q"=001 and the binary representation of "r"=01, the Golomb code word $G_7(15)$=00101.

Decode

In order to decode this codeword, the number of zero bits left of the first one bit are counted to give the value of "q". In our example, since there are two zero bits left of the first one bit, "q"=2. The first one bit is then discarded, and the remaining bits are converted from the binary system to the base system to yield "r"=1. The original integer "a" is reconstructed as: a=b*q+r=7*2+1=15.

Drawbacks With Golomb's Scheme

There are several drawbacks with this scheme. One problem is that the code base "b" has to be known by the computer prior to decoding the data file. Since there are several kinds of popular operating systems, and a plethora of sources for data files, the knowledge of the base code "b" limits the scope of this scheme. Moreover, the choice of the code base "b" influences the efficiency of data compression. For a given non-integer "a", a small value for the code base "b" produces a large value for quotient "q", which equates to a long unary representation of "q" and a small value for remainder "r", which equates to a short binary representation of "r", while on the other hand a large value for the code base "b" for the same non-integer "a" produces the opposite results. Since finding the optimal value for the code base "b" for a given set of data is computationally difficult, the chances of getting an efficient compression scheme as opposed to an inefficient one is equally possible.

Even though the Golomb scheme like the Huffman scheme has no definitive markers to separate the codeword of one character from another, it is easier to decode a data file using the Golomb scheme because it uses the same algorithm to encode each character irrespective of its frequency in the data file. Hence, the codeword for each character is the same for all data files irrespective of size, kind, or changes made to them as long as the base code "b" is known and remains unchanged. As mentioned earlier, since code base "b" has to be known by the computer prior to decoding, this scheme is not universally accepted and loses its advantage over Huffman's scheme.

SUMMARY OF THE INVENTION

The present invention provides an entropy coding scheme using an adaptable prefix code. The prefix code is a binary representation of the algorithm used to compress and decompress the data. There are prefix zeros that represent the number of binary digits that follow the first one. For example, the entropy codeword for 14 is 000011110 because the sequence of bits following the first one (1110) is the binary representation of 14, and its length equals the number of prefix zeros before the first one bit. According to one embodiment, this scheme works on both positive and negative integers. In another embodiment, the zero integer is handled as a special case and is assigned the shortest codeword. In yet another embodiment, since the present scheme uses the shortest codeword for the zero integer, it is preferred by data sets that are clustered about zero, such as image data sets that have been transformed via a wavelet transform or a discrete cosine transform.

Since many modern computer instruction set architectures include an instruction that can count the number of leading zeros in a word, the present scheme in another embodiment makes use of this instruction in the encoding and decoding of the data file.

BRIEF DESCRIPTION OF THE DRAWINGS

These and other features, aspects and advantages of the present invention will become better understood with regard to the following description, appended claims and accompanying drawings where:

DETAILED DESCRIPTION OF THE INVENTION

The invention provides an entropy coding scheme using an adaptive prefix code. In the following description, numerous specific details are set forth to provide a more thorough description of embodiments of the invention. It is apparent, however, to one skilled in the art, that the invention may be practiced without these specific details. In other instances, well known features like the transmittal and storage of encoded data, have not been described in detail so as not to obscure the invention.

The present invention can compress a data file so that it not only occupies less space, but is faster to transmit than an uncompressed data file. The decoding process is extremely easy to perform which is preferred by any computing machine, especially by thin clients that do not have a lot of power or memory. Even though the compression ratio (encoding) of the present invention is sometimes not as compact as one using the optimal Huffman's code, the decoding procedure is much faster than any of the prior art schemes, which improves on the overall performance.

Encoding

Representing all kinds of data in a numerical form, the present invention can encode both positive and negative integers including zero. The present invention has particular application to data sets that are clustered about the zero integer, such as image data sets that have been transformed via a wavelet transform or a discrete cosine transform. The present invention chooses the shortest codeword for the zero value, which is the most probable integer in the image data set. Since positive and negative one are the next most probable integers in an image data set transformed using a wavelet transform, or a discrete cosine transform, the present invention encodes positive and negative one with the next shortest codeword, and so on. Moreover, since most image data sets are clustered around zero, the codeword for most sets are short, and hence easy to encode.

Table 2 shows the encoding of a few integers, and it can be seen that the codeword for zero (the most frequently occurring integer in image data sets) is the shortest (just one bit), followed by positive and negative one (three bits), and so on. The present invention, when applied to image data, assumes the frequency of data is centered around zero, and so does not require a first pass through the file to determine character frequency.

TABLE 2

| Integer | Codeword | Integer | Codeword | Integer | Codeword |
| --- | --- | --- | --- | --- | --- |
| 0 | 1 | +4 | 0001100 | +7 | 0001111 |
| +1 | 011 | −4 | 0001000 | −7 | 0001011 |
| −1 | 010 | +5 | 0001101 | +8 | 000011000 |
| +2 | 00110 | −5 | 0001001 | −8 | 000010000 |
| −2 | 00100 | +6 | 0001110 | +9 | 000011001 |

TABLE 2-continued

| Integer | Codeword | Integer | Codeword | Integer | Codeword |
| --- | --- | --- | --- | --- | --- |
| +3 | 00111 | −6 | 0001010 | −9 | 000010001 |
| −3 | 00101 | +7 | 0001111 | | |

Figure 1:
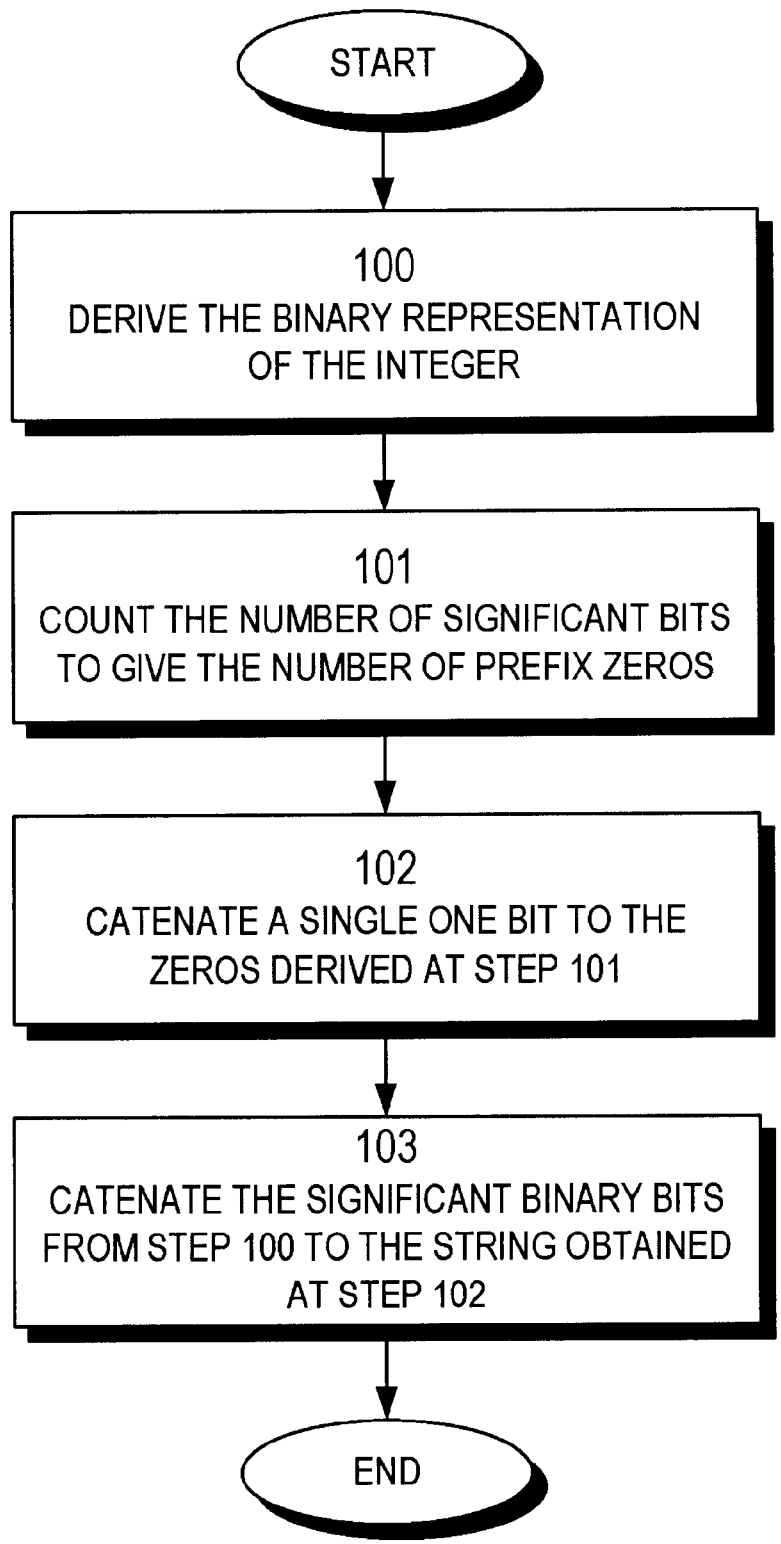
FIG. 1 is a flowchart to encode a positive number.

In one embodiment, the present invention handles positive integers as illustrated in FIG. 1. At step 100, the binary representation of the integer to be compressed is derived (the example assumes a stream of data integer values to be compressed). Next, at step 101, the number of significant bits in the binary representation is counted. This count gives the number of prefix zeros before the first one. At step 102, a single one bit is catenated to the zeros obtained at step 101. Finally, at step 103, the significant binary digits of the non-negative integer calculated at step 100 is catenated to the string derived at step 102. The number of prefix zeros gives the first built-in marker which tells the computer system that the encoded word to watch for will be as long as the number of prefix zeros. The single one bit at step 102 gives the second built-in marker which tells the computer system that depending on the number of prefix zeros an equal number of bits following the one bit are the binary representation of the actual data.

Figure 2:
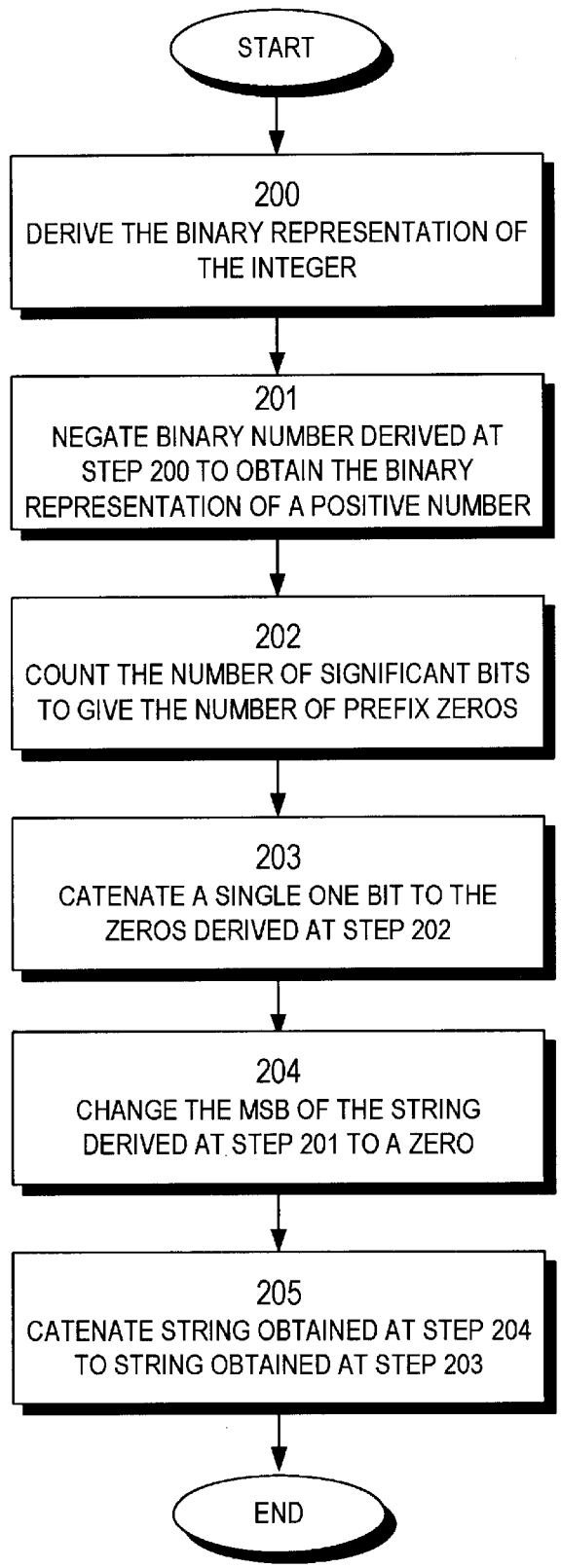
FIG. 2 is a flowchart to encode a negative number.

The present invention handles negative integers as illustrated in FIG. 2. At step 200, the binary representation of the integer is derived. At step 201, this binary representation is negated to obtain a binary representation of a positive integer. At step 202, the number of significant bits in the new binary representation is counted to obtain the number of prefix zeros before the first one. At step 203, a single one bit is catenated to the zeros obtained at step 202. At step 204, the MSB of the binary representation of the positive integer is cleared to a zero. Finally, at step 205 the binary representation of the positive integer obtained at step 201 with the MSB set to a zero is catenated to the string obtained at step 203. As shown earlier, the number of prefix zeros, as well as the single one bit at step 203 give the two built-in markers which indicate to the computer system not only the length of the codeword, but also its starting and ending bits.

Decoding

Since automatic markers are built-in to the codewords, the decoding process is easy and quick, and is hence preferred by computer systems, especially thin clients that do not possess much computing power, or memory.

Figure 3:
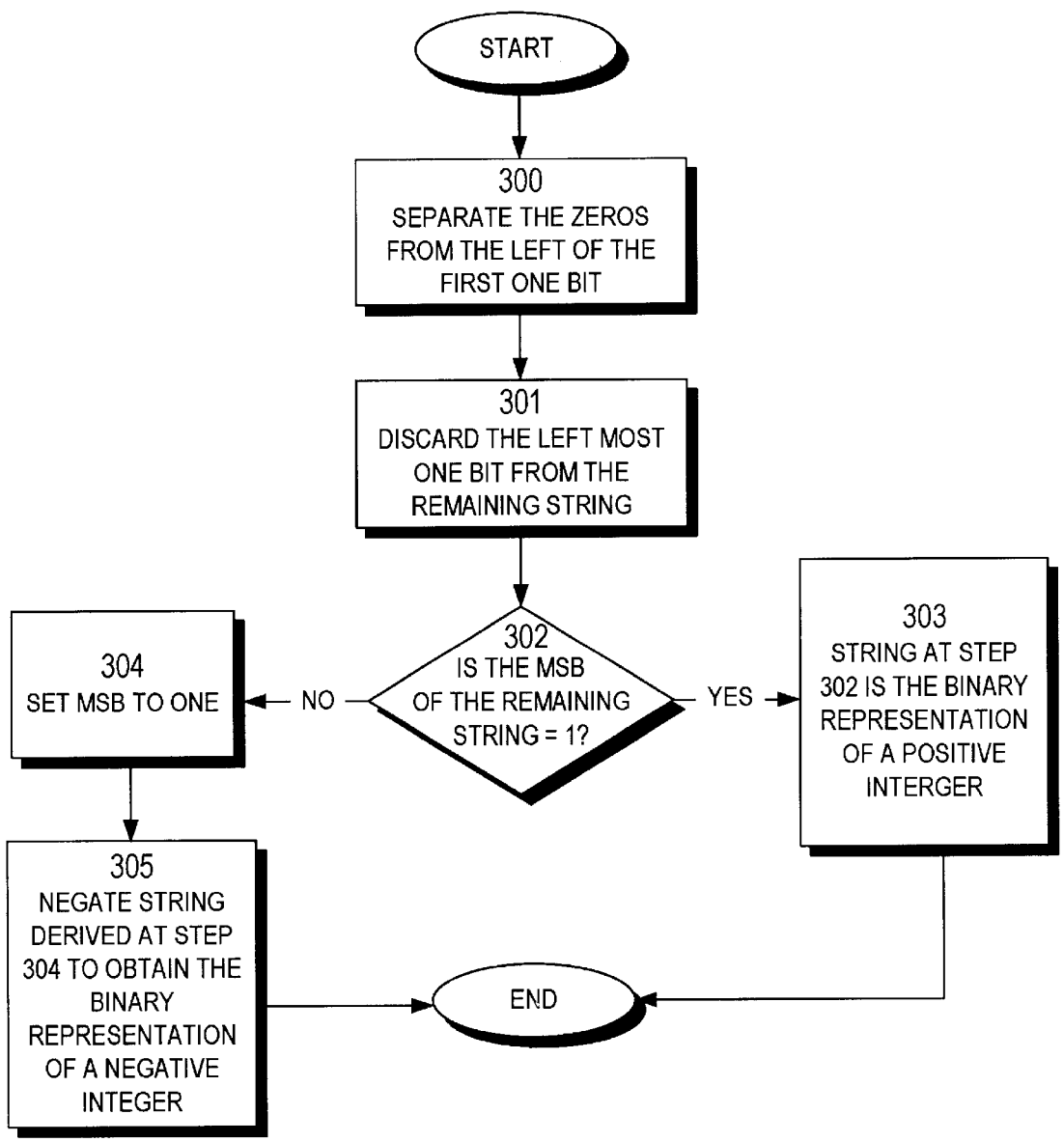
FIG. 3 is a flowchart to decode a positive or negative number.

The decoding of positive and negative integers is handled as illustrated in FIG. 3. At step 300, the system looks for prefix zeros. The number of prefix zeros, which flags the first built-in marker, left of the first one bit is separated from the rest of the codeword. The number of prefix zeros gives the number of significant bits in the integer. If for example, there are three prefix zeros then the number of significant bits in the integer is also three. At step 301, the leftmost one which is the second built-in marker is discarded. Since the number of prefix zeros gives the length of the codeword to watch for after the first one bit, the computer system checks the bits following the one bit equal to the number of prefix zeros, which makes decoding very easy. At step 302 the remaining string is examined to see if the MSB is a one. If the MSB is a one, it means that the codeword is a binary representation of a positive integer. At step 303 the binary representation of the string gives the value of the positive integer which will have the same number of significant bits as the number of prefix zeros counted at step 300. If the MSB is a zero, it means that the codeword is a binary representation of a negative integer and is set to a one at step 304. At step 305, the string with the MSB set to a one is negated to obtain the binary representation of a negative integer which will have the same number of significant bits as the number of prefix zeros counted at step 300.

Encoding And Decoding Of Zero

Figure 4:
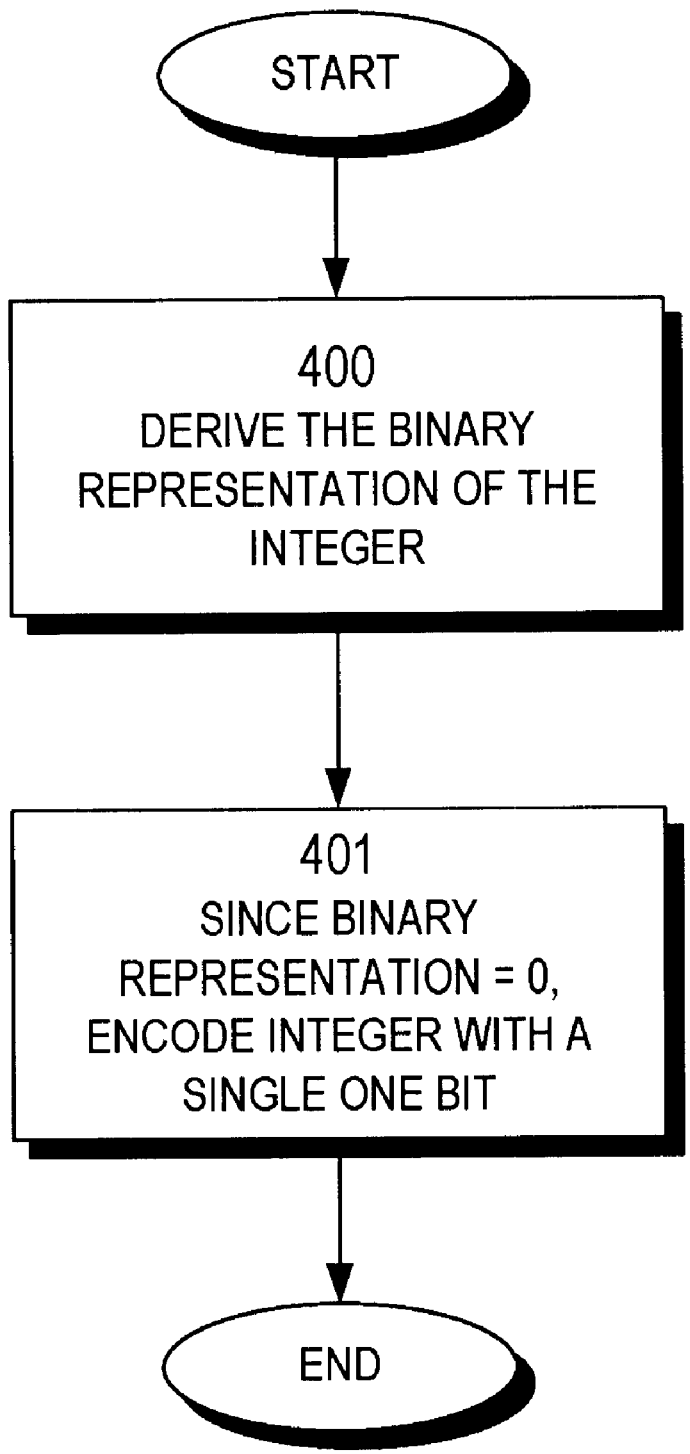
FIG. 4 is a flowchart to encode zero.
Figure 5:
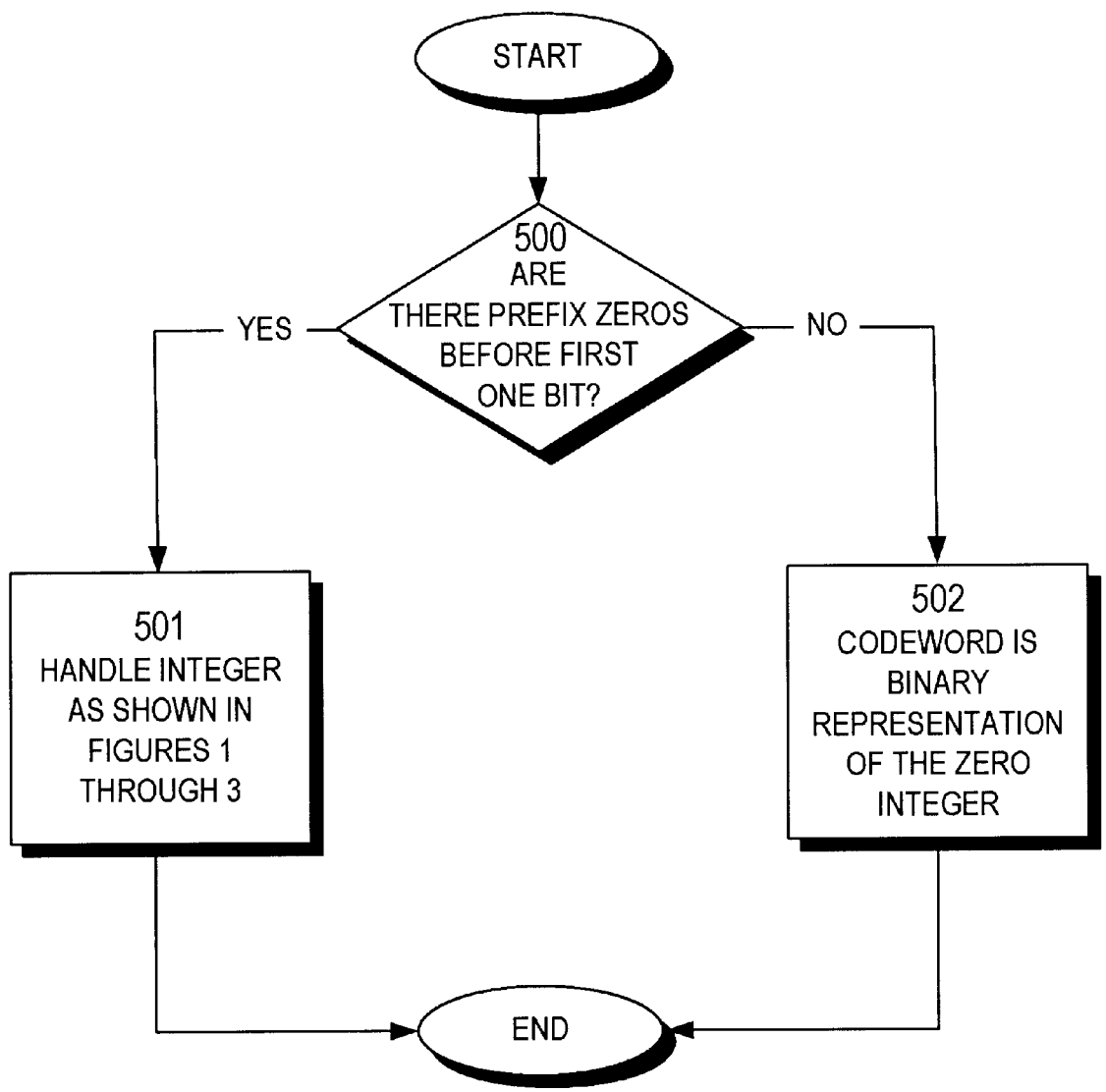
FIG. 5 is a flowchart to decode zero.

According to one embodiment, the scheme handles the zero integer differently from the other integers and the encoding is illustrated in FIG. 4. At step 400, the binary representation of zero is derived. Since the binary representation is the same as the integer itself, the integer is encoded by a single bit that is set to one at step 401. The decoding process for zero is straight forward because there are no prefix zeros before the first (and only) one, and is illustrated in FIG. 5. At step 500, the scheme checks for prefix zeros. If prefix zeros are found before the first one, then at step 501 the scheme concludes the integer to be either positive or negative and handles them as seen in FIGS. 1 through 3. If on the other hand, no prefix zeros are found before the first one the scheme concludes the codeword to represent a zero at step 502.

EXAMPLE

As an example, a data string comprising of integers 0, 0, 1, –2, and 4 is first encoded and subsequently decoded using the scheme as explained in FIGS. 1 through 5. Referring to the table, it can be seen that this sequence should code to the following string, namely 11011001000001100.

Encode

To encode, we follow steps shown in FIGS. 1, 2 and 4 for each integer in the string. For the first integer, 0, the binary representation is 0. There are no significant bits in 0 so there are no prefix zeros and the single bit 1 is derived to represent 0. At this point the derived string consists of the single bit 1. The next integer is also zero, resulting in an encoded value of 1 and the string now consists of the bits 11.

For the next integer value of 1, there is one significant bit. Thus, a single prefix zero is determined at step 101. A single bit is concatenated to the prefix zeros at step 102. The value of the integer is then represented following the concatenated marker bit following the prefix zero. In this case it is the bit 1. The value for an integer of 1 is 011 and the string generated thus far is 11011.

The next integer is a –2 so the steps of FIG. 2 are used. The binary representation of the integer is 10, two significant bits. Thus there must be two prefix zeros. A marker bit is concatenated at step 203. The value of the integer in binary is 10 but because it is negative, this scheme requires that the MSB is changed at step 204, leaving 00. That value is concatenated onto the string from step 203 to yield 00100. The string so far for the integers 0, 0, 1, and –2 is 1101100100.

To encode the integer 4, the steps of FIG. 1 are used. 4 is represented as 100 in binary, with three significant bits. Thus, step 101 yields 3 prefix zeros. A marker bit is concatenated at step 102, giving 0001. The binary representation is concatenated at step 103 giving 0001100. The entire string of five integers is thus represented by 11011001000001100.

Decoding

Next, we decode the string obtained at step 103 as: the prefix zeros are separated at step 300 which will also give the number of significant bits in the integer. In our example, there are no prefix zeros before the first one bit (step 500) indicting that the first value of the encoded string is a zero (step 502). This means that there are no bits to watch for after the first one bit as the first value of the string has already been determined to be a zero. After discarding the first one bit (step 301), the system encounters no prefix zeros (step 500) before the next one bit, which again indicates to the system that the next value of the string is another zero (step 502). After discarding the next one bit (step 301), the remaining encoded string looks like: 011001000001100. Since the system encounters a single zero, which it separates, before the next one bit (step 300), this indicates that a single bit has to be decode following this one bit to give the third value of the string. After discarding the one bit (step 301), the number of bits of the string equal to the number of prefix zeros (in this case 1 bit) of the remaining string (1001000001100) is checked. Since the next one bit of the remaining string equals 1 (step 302), the string is a binary representation of a positive integer (step 303). Decoding just one bit gives us the third value of the string, which is 1.

Next, the remaining encoded string (001000001100) is examined. Since there are 2 prefix zeros, which are separated (step 300), the system knows that the next value of the string has two significant binary digits that it has to decode. Discarding the leftmost one bit (step 301), the MSB of the remaining string (000001100) is checked. Since the MSB of the remaining string equals 0, the string is a binary representation of a negative integer (step 304). Reversing that MSB at step 305 and examining the remaining value of 10 results in an integer value of –2.

Next, the remaining encoded string (0001100) is examined. Since there are 3 prefix zeros, which are separated (step 300), the system knows that the next value of the string has three significant binary digits that it has to decode. Discarding the leftmost one bit (step 301), the MSB of the remaining string (100) is checked. Since the MSB of the remaining string equals 1, the string is a binary representation of a positive integer (step 303). Decoding the three bits gives us the fifth and final value of the string, which is a 4. Hence, the original string of 0, 0, 1, –2, and 4 is decoded back to its original form.

Conclusion

Unlike Huffman's scheme where a codeword represents a character based on its frequency in the file, the present scheme makes use of the binary representation of each character prefixed with zeros equal to the number of significant bits in the binary representation followed by a single one bit which acts as the delimiter. Since frequency is not used to encode and decode the character, the length of the codeword depends solely on its binary representation and hence does not grow rapidly (see Table 1). Moreover, since there is no table of codewords to match during decoding, the present scheme is more efficient because it does not have make multiple passes of the file like the Huffman's scheme.

The present invention is more efficient then Golomb's scheme because there is no predetermined code base which can make the length of the unary and binary parts of the codeword difficult and lengthy to decode. Since the present invention does not make use of a predetermined code base, it is not restricted in. its scope, and does not incur extra overhead for the computing system, especially thin clients, making the present invention highly efficient. Moreover, there are no arithmetic operations to decode the original character as in the case of Golumb's scheme, making the overall performance of the present invention better than any prior art schemes.

Most modem computer instruction set architectures, like RISC (reduced instruction set computer) or HLLC (high level language computer), include an instruction that can count the number of leading zeros in a word. This instruction, which comes standard on most modem computers, can be useful in encoding and decoding with the new entropy coding technique described herein thereby reducing overhead costs.

Thus, an entropy coding scheme using an adaptive prefix code is described in conjunction with one or more specific embodiments. The invention is defined by the following claims and their full scope of equivalents.

I claim:

1. An entropy coding scheme comprising:

receiving an integer to be coded;

converting the integer to its binary representation;

counting a number of prefix zeros equal to the number of significant bits in the binary representation;

catenating a single bit whose binary value equals one to the number of prefix zeros to form a string; and catenating the binary representation of the integer to the string to yield the coded value of the integer.

2. The scheme of claim 1 wherein the MSB of the significant bits of the binary representation of the integer is inverted when the received integer is negative.

3. An entropy decoding scheme comprising:

receiving a binary string;

counting and discarding any prefix zeros preceding the first one bit of the binary string to yield the number of significant bits in the binary representation of an integer;

discarding the first one bit;

checking for a string or length equal to the prefix zeros discarded; and converting the binary value of the string to a decoded integer.

4. The scheme of claim 3 further comprising:

concluding that the string is a zero if there are no prefix zeros to be discarded.

5. The scheme of claim 3 further comprising:

concluding that the string is a binary representation of a positive integer if there are discarded prefix zeros and the MSB of the string equals one.

6. The scheme of claim 3 further comprising:

concluding that the string is a binary representation of a negative integer if there are discarded prefix zeros and the MSB of the string equals zero.

7. The scheme of claim 6 further comprising:

inverting the MSB of the string which is a binary representation of a negative integer to a one to obtain the negative integer value.

8. An article of manufacture comprising:

a computer usable medium having computer readable program code embodied therein for an entropy coding scheme, said computer readable program code in said article of manufacture comprising:

computer readable program code configured to cause said computer to receive an integer to be coded;

computer readable program code configured to cause said computer to convert the integer to its binary representation;

computer readable program code configured to cause said computer to count a number of prefix zeros equal to the number of significant bits in the binary representation;

computer readable program code configured to cause said computer to catenate a single bit whose binary value equals one to the number of prefix zeros to form a string; and computer readable program code configured to cause said computer to catenate the binary representation of the integer to the string to yield the coded value of the integer.

9. The article of manufacture of claim 8 wherein computer readable program code configured to cause said computer to invert the MSB of the significant bits of the binary representation of the integer when received integer is negative.

10. An article of manufacture comprising:

a computer usable medium having computer readable program code embodied therein for an entropy decoding scheme, said computer readable program code in said article of manufacture comprising:

computer readable program code configured to cause said computer to receive a binary string;

computer readable program code configured to cause said computer to count and discard any prefix zeros preceding the first one bit of the binary string to yield the number of significant bits in the binary representation of an integer;

computer readable program code configured to cause said computer to discard the first one bit;

computer readable program code configured to cause said computer to check for a string or length equal to the prefix zeros discarded; and computer readable program code configured to cause said computer to convert the binary value of the string to a decoded integer.

11. The article of manufacture of claim 10 further comprising:

computer readable program code configured to cause said computer to conclude that the string is a zero if there are no prefix zeros to be discarded.

12. The article of manufacture of claim 10 further comprising:

computer readable program code configured to cause said computer to conclude that the string is a binary representation of a positive integer if there are discarded prefix zeros and the MSB of the string equals one.

13. The article of manufacture of claim 10 further comprising:

computer readable program code configured to cause said computer to conclude that the string is a binary representation of a negative integer if there are discarded prefix zeros and the MSB of the string equals zero.

14. The article of manufacture of claim 13 further comprising:

computer readable program code configured to cause said computer to invert the MSB of the string which is a binary representation of a negative integer to a one to obtain the negative integer value.

* * * * *